United States Patent
Kwak

(10) Patent No.: US 7,619,436 B2
(45) Date of Patent: Nov. 17, 2009

(54) DISPLAY SUBSTRATE AND APPARATUS AND METHOD FOR TESTING DISPLAY PANEL HAVING THE SAME

(75) Inventor: Sang-Ki Kwak, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/451,035

(22) Filed: Jun. 12, 2006

(65) Prior Publication Data
US 2006/0284257 A1 Dec. 21, 2006

(30) Foreign Application Priority Data
Jun. 10, 2005 (KR) ............... 10-2005-0049914

(51) Int. Cl.
*G01R 31/00* (2006.01)
(52) U.S. Cl. .................................. 324/770
(58) Field of Classification Search ........... 324/765, 324/769–770
See application file for complete search history.

(56) References Cited

U.S. PATENT DOCUMENTS

| | | | |
|---|---|---|---|
| 5,909,035 A * | 6/1999 | Kim | 257/59 |
| 6,043,971 A * | 3/2000 | Song et al. | 361/111 |
| RE37,847 E * | 9/2002 | Henley et al. | 382/141 |
| 6,493,047 B2 * | 12/2002 | Ha | 349/40 |
| 6,794,892 B2 * | 9/2004 | Matsueda | 324/770 |
| 7,362,124 B2 * | 4/2008 | Kim et al. | 324/770 |
| 2002/0105512 A1 * | 8/2002 | Kwon | 345/212 |
| 2003/0020845 A1 * | 1/2003 | Lee et al. | 349/40 |

* cited by examiner

*Primary Examiner*—Ha Tran T Nguyen
*Assistant Examiner*—Joshua Benitez
(74) *Attorney, Agent, or Firm*—Cantor Colburn LLP

(57) ABSTRACT

A display substrate includes a gate pad part, a source pad part, a first static dissipative part, and a first test part. A gate pad part is formed on one terminal of each of a plurality of gate lines and transfers signals to the gate lines. A source pad part is formed on one terminal of each of a plurality of source lines and transfers signals to the source lines. A first static dissipative part disperses static charge that flows into the source pad part. A first test part receives a first test signal, makes electrical contact with the first static dissipative part, and transfers the first test signal to the source lines through the first static dissipative part. A display apparatus including the display substrate transmits first test signals that are uniformly applied to source lines through a first test part, so defects are easily detected through a gross test.

21 Claims, 13 Drawing Sheets

DISPLAY SUBSTRATE AND APPARATUS AND METHOD FOR TESTING DISPLAY PANEL HAVING THE SAME

This application claims priority to Korean Patent Application No. 2005-49914, filed on Jun. 10, 2005 and all the benefits accruing therefrom under 35 U.S.C. §119, and the contents of which in its entirety are herein incorporated by reference.

BACKGROUND OF THE INVENTION

1. Field of the Invention

The present invention relates to a display substrate, an apparatus for testing a display panel having the display substrate, and a method for testing a display panel having the display substrate. More particularly, the present invention relates to a display substrate capable of simplifying a gross test, an apparatus for testing a display panel having the display substrate, and a method for testing a display panel having the display substrate.

2. Description of the Related Art

In general, a liquid crystal display ("LCD") panel module includes an LCD panel and a driving device electrically connected to the LCD panel to drive the LCD panel.

The LCD panel includes an array substrate, an upper substrate facing the array substrate, and a liquid crystal layer disposed between the array substrate and the upper substrate. In a manufacturing process of the LCD panel, a defect formed by a particle decreases a yield of the manufacturing process. In particular, an open circuit or a short circuit, which is formed on a line of the LCD panel due to the particle, causes a decrease in the yield of the manufacturing process.

First, the array substrate is tested by applying electric signals to the line of the array substrate to perform an array test in the manufacturing process. The array substrate is combined with the upper substrate, and liquid crystals are injected between the array substrate and the upper substrate. Second, the LCD panel is tested by applying a light generated from a backlight assembly (or a front light assembly) and electric signals to the LCD panel to perform a visual inspection test in the manufacturing process.

Third, the LCD panel is tested to detect pixel defects and line defects through a gross test before the driving device is combined with the LCD panel. When defects are not detected in the LCD panel in the gross test, the driving device is mounted on the LCD panel, thereby completing the LCD panel module.

In the gross test, pins of a test apparatus make contact with pads of the LCD panel to apply test signals to the LCD panel through the pins to test the LCD panel. However, when the pins of the test apparatus do not make precise contact with the pads of the LCD panel, credibility of the gross test is decreased by a misconnection between the pins of the test apparatus and the pads of the LCD panel.

BRIEF SUMMARY OF THE INVENTION

Exemplary embodiments of the present invention provide a display substrate capable of simplifying a gross test.

Exemplary embodiments of the present invention also provide an apparatus for testing a display panel having the above-mentioned display substrate.

Exemplary embodiments of the present invention also provide a method for testing a display panel having the above-mentioned display substrate.

In exemplary embodiments of the present invention, a display substrate includes a gate pad part, a source pad part, a first static dissipative part, and a first test part. A gate pad part is disposed on one terminal of each of a plurality of gate lines to transfer a signal to each of the gate lines. A source pad part is disposed on one terminal of each of a plurality of source lines to transfer a signal to each of the source lines. A first static dissipative part disperses a static charge forwarded to the source pad part. A first test part, receiving a first test signal, is electrically connected to the first static dissipative part so that a first test signal is applied to the source lines through the first static dissipative part.

The first test part may include a first test line electrically connected to the first static dissipative part, and a first test pad electrically connected to the first test line and receiving the first test signal. The first test signal may be a data voltage corresponding to a gray-scale.

The display substrate may further include a second static dissipative part dispersing a static charge applied to the gate pad part, and a second test part electrically connected to the second static dissipative part so that a second test signal is applied to the gate lines through the second static dissipative part. The second test signal may be a gate-on voltage activating the gate lines. The second test signal and the first test signal may be substantially simultaneously applied to the gate and source lines.

The second test part may include a second test line electrically connected to the second static dissipative part, and a second test pad electrically connected to the second test line and receiving the second test signal.

The display substrate may further include a plurality of pixel parts defined by the gate and source lines, and the first static dissipative part is formed between the source pad part and the pixel parts. The display substrate may further include a static discharging part discharging a static charge applied to the first static dissipative part, and the static discharging part may be disposed between the first static dissipative part and the pixel parts.

The second static dissipative part may be disposed between the gate pad part and the pixel parts.

The first static dissipative part may include a plurality of first diodes. Each of the first diodes may include a transistor including a gate electrode electrically connected to the first test part, a source electrode electrically connected to the first test part, and a drain electrode electrically connected to one of the source lines.

The second static dissipative part may include a plurality of second diodes. Each of the second diodes may include a transistor including a gate electrode electrically connected to the second test part, a source electrode electrically connected to the second test part, and a drain electrode electrically connected to one of the gate lines.

In other exemplary embodiments of the present invention, a display substrate includes a gate pad part, a first static dissipative part and a first test part. The gate pad part is on one terminal of each of a plurality of gate lines, and transfers a signal to each of the gate lines. The first static dissipative part disperses a static charge applied to the gate pad part. The first test part receives a first test signal, and is electrically connected to the first static dissipative part. The first test signal is applied to the gate lines through the first static dissipative part.

In still other exemplary embodiments of the present invention, an apparatus for testing a display panel includes a plurality of pixel parts, a first test part electrically connected to a plurality of source lines through a first static dissipative part, and a second test part electrically connected to a plurality of gate lines through a second static dissipative part. The apparatus for testing the display panel includes a first signal generator, a second signal generator, a third signal generator, and a fourth signal generator. A first signal generator is electrically connected to the source lines to apply a source test signal to the source lines. A second signal generator is electrically connected to the gate lines to apply a gate test signal to the gate lines. A third signal generator is electrically connected to the first test part to apply a first test signal to the first test part. A fourth signal generator is electrically connected to the second test part to apply a second test signal to the second test part.

In still other exemplary embodiments of the present invention, a method for testing a display panel is provided as follows. The display panel includes a plurality of pixels, a first test part electrically connected to a plurality of source lines through a first static dissipative part, and a second test part electrically connected to a plurality of gate lines through a second static dissipative part. A gate test signal and a source test signal are applied to the gate and source lines, respectively, to firstly detect defects of the display panel. A first test signal and a second test signal are applied to the first and second test parts, respectively, to secondly detect defects of the display panel.

According to the display substrate, the apparatus for testing the display panel having the display substrate and the method for testing the display panel having the display substrate, the gross test is performed on the display substrate having the test part electrically connected to the static dissipative part so that a line defect may be easily tested.

BRIEF DESCRIPTION OF THE DRAWINGS

The above and other features and advantages of the present invention will become readily apparent by reference to the following detailed description when considered in conjunction with the accompanying drawings, in which.

DETAILED DESCRIPTION OF THE INVENTION

Figure 1:
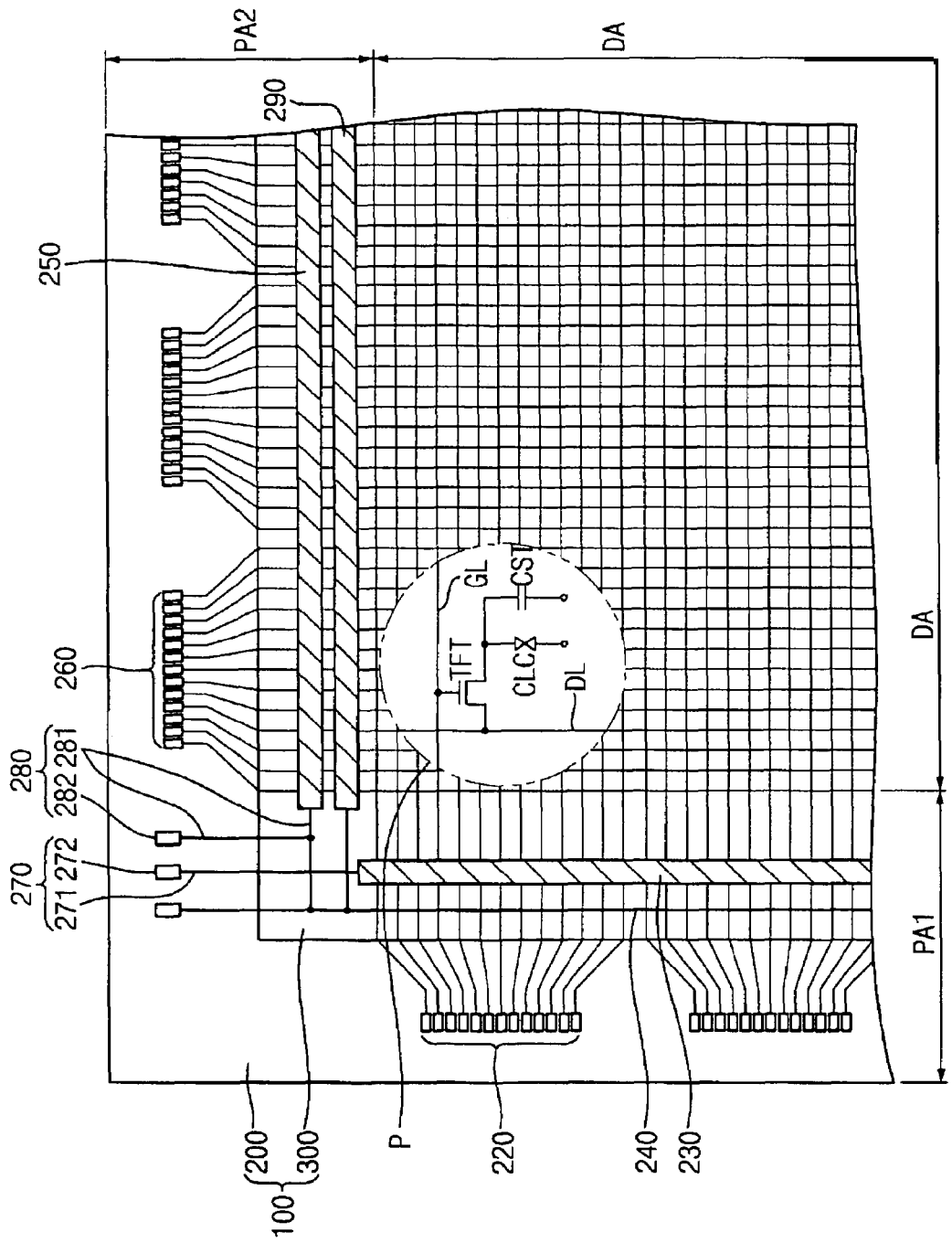
FIG. 1 is a plan view illustrating an exemplary display panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a plan view illustrating an exemplary display panel according to an exemplary embodiment of the present invention.

Referring to FIG. 1, the display panel 100 includes a first display substrate 200, a second display substrate 300 facing the first display substrate 200, and a liquid crystal layer (not shown) interposed between the first and second display substrates 200 and 300.

The first display substrate 200 includes a display region DA and a peripheral region PA, including first and second peripheral regions PA1 and PA2, surrounding the display region DA.

The display region DA includes a plurality of source lines DL, also known as data lines, extended in a first direction, a plurality of gate lines GL extended in a second direction, and a plurality of pixel parts P defined by the source and gate lines DL and GL. The second direction is substantially perpendicular to the first direction such that the pixel parts P are arranged in a matrix. Each of the pixel parts P includes a switching element, such as a thin film transistor, TFT, a liquid crystal capacitor CLC, and a storage capacitor CST.

A gate pad part 220, a first diode static dissipative part 230, and a storage voltage line 240 are formed in the first peripheral region PA1 of the peripheral region PA. The storage voltage line 240 may be formed between the gate pad part 220 and the first diode static dissipative part 230.

The gate pad part 220 includes a plurality of pads that transfer gate signals to the gate lines GL in the display region DA. The pads may be arranged in groups with connecting lines fanning out to the gate lines GL.

The first diode static dissipative part 230 includes a plurality of first diodes, as will be further described below, which disperse static charge from the gate pad part 220 during a manufacturing process of the display panel 100. The first diodes protect the display region DA from the static charge.

The first diode static dissipative part 230 is electrically connected to the storage voltage line 240 to compensate the static charge.

A common voltage Vst is applied to the storage voltage line 240. The common voltage Vst applied to the storage voltage line 240 is applied to the storage capacitor CST in each of the pixel parts P. The storage voltage line 240 may extend substantially parallel to the source lines DL.

A second diode static dissipative part 250, a source pad part 260, a first test part 270, a second test part 280, and a static discharging part 290 are formed in a second peripheral region PA2 of the peripheral region PA. The second peripheral region PA2 may extend along a second side of the display region DA which is substantially perpendicular to a first side of the display region DA on which the first peripheral region PA1 extends.

The source pad part 260 includes a plurality of pads 261 that transfer data signals to the source lines DL in the display region DA. The pads may be arranged in groups with connecting lines fanning out to the source lines DL.

The second diode static dissipative part 250 includes a plurality of second diodes, as will be further described below, that discharge a static charge from the source pad part 260 during the manufacturing process of the display panel 100. The second diodes protect the display region DA of the display panel 100 from the static charge. The second diode static dissipative part 250 is electrically connected to the storage voltage line 240 to compensate the static charge. The storage voltage line 240 may extend from the first peripheral region PA1 into the second peripheral region PA2. A pad for the storage voltage line 240 for receiving the common voltage Vst may be adjacent a pad for the first test part 270.

The first test part 270 includes a first test line 271 and a first test pad 272. The first test line 271 is electrically connected to the first diode static dissipative part 230. The first test line 271 may extend substantially parallel to the storage voltage line 240. The first test pad 272 transfers a first test signal to the first test line 271. The first test signal from the first test part 270 is applied to the gate lines GL through the first diode static dissipative part 230.

The second test part 280 includes a second test line 281 and a second test pad 282. The second test line 281 may extend substantially parallel to the first test line 271. The second test line 281 is electrically connected to the second diode static dissipative part 250, such as via a connecting line. The second test pad 282 transfers a second test signal to the second test line 281. The second test signal from the second test part 280 is applied to the source lines DL through the second diode static dissipative part 250.

The static discharging part 290 may be formed between the second diode static dissipative part 250 and the display region DA. One terminal of the second diode static dissipative part 250 is electrically connected to the storage voltage line 240. The static discharging part 290 includes a plurality of transistors that are electrically connected to the source lines DL, respectively. The static discharging part 290 removes a residual static charge that is discharged from the second diode static dissipative part 250 to prevent a malfunction of the switching element TFT in the display region DA. Examples of malfunctions that can be formed in the switching element TFT include a tick, a disconnection, a short circuit, etc. In a tick, a channel part of the switching element TFT in the display region DA is divided into a plurality of portions.

Figure 2:
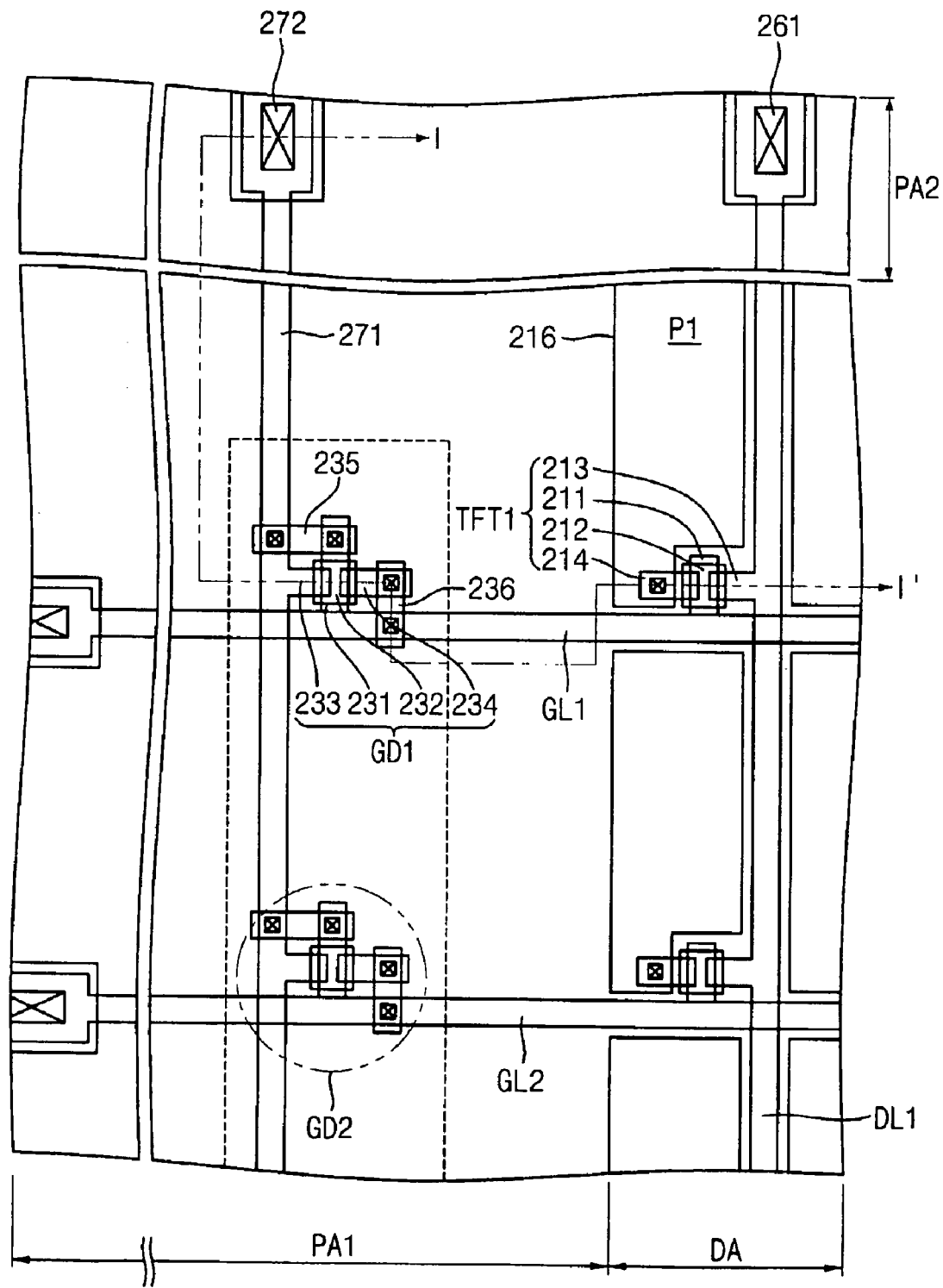
FIG. 2 is a partial plan view illustrating an exemplary first display substrate shown in FIG. 1.
Figure 3:
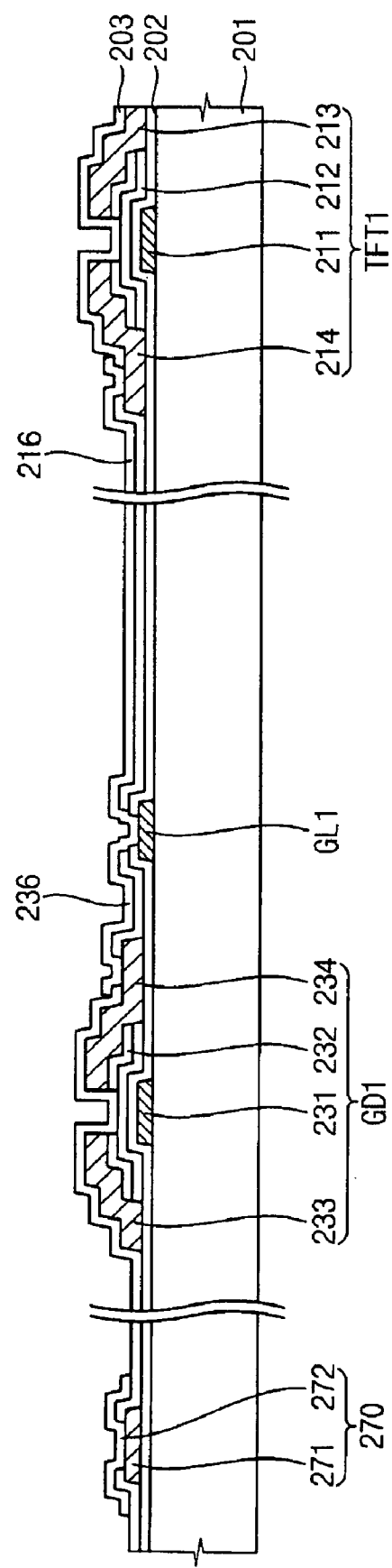
FIG. 3 is a cross-sectional view taken along line I-I' shown in FIG. 2.

FIG. 2 is a partial plan view illustrating an exemplary first display substrate shown in FIG. 1. FIG. 3 is a cross-sectional view taken along line I-I' shown in FIG. 2.

Referring to FIGS. 1 to 3, the first display substrate 200 includes a base substrate 201. A plurality of pixel parts P, a first diode static dissipative part 230, and a first test part 270 are formed on the base substrate 201.

One pixel part P1 of the pixel parts P includes a switching element, a thin film transistor, TFT1 and a pixel electrode 216. The switching element TFT1 includes a gate electrode 211, a source electrode 213, and a drain electrode 214. The gate electrode 211 is electrically connected to a gate line GL1. The source electrode 213 is electrically connected to a source line DL1. The drain electrode 214 is electrically connected to the pixel electrode 216. A channel part 212 is formed on the gate electrode 211 between the source and drain electrodes 213 and 214.

In addition, a gate-insulating layer 202 is formed between the gate electrode 211 and the channel part 212. A passivation layer 203 is formed on the source and drain electrodes 213 and 214. The remaining pixel parts P may be arranged similar to the pixel part P1.

The first diode static dissipative part 230 includes a plurality of first diodes GD1, GD2, . . . , that are electrically connected to the gate lines GL1, GL2, . . . , respectively. The first test line 271 of the first test part 270 is electrically connected to the first diode static dissipative part 230. The first test pad 272 is on one terminal of the first test line 271.

In particular, each of the first diodes GD1, GD2, . . . , includes a gate electrode 231, a source electrode 233, and a drain electrode 234. The gate and source electrodes 231 and 233 of each of the first diodes GD1, GD2, . . . , are electrically connected to the first test line 271. The drain electrode 234 of each of the first diodes GD1, GD2, . . . , is electrically connected to each of the gate lines GL1, GL2, . . . .

The source electrode 233 of each of the first diodes GD1, GD2, . . . , is extended from the first test line 271, and is thus electrically connected to the first test line 271. The gate electrode 231 of each of the first diodes GD1, GD2, . . . , is electrically connected to the first test line 271 through a first connecting pattern 235. The first connecting pattern 235 may be connected to the gate electrode 231 and the first test line 271 via contact holes exposing portions of the gate electrode 231 and the first test line 271.

The drain electrode 234 of each of the first diodes GD1, GD2, . . . , is electrically connected to the gate line GL1, GL2, . . . through a second connecting pattern 236. The second connecting pattern 236 may be connected to the drain electrode 234 and the gate line GL1, GL2, . . . via contact holes exposing portions of the drain electrode 234 and the gate line GL1, GL2, . . . . Each of the first diodes GD1, GD2, . . . , may further include a channel part 232 on the gate electrode 231 between the source and drain electrodes 234 and 231. The first and second connecting patterns 235 and 236 are formed from substantially the same layer as the pixel electrode 216 that is formed in the pixel part P1. The first and second connecting patterns 235 and 236 include a conductive material.

In addition, a gate-insulating layer 202 is formed between the gate electrode 231 and the channel part 232 of each of the first diodes GD1, GD2, . . . . A passivation layer 203 is formed on the source and drain electrodes 233 and 234 of each of the first diodes GD1, GD2, . . . .

The first test line 271 of the first test part 270 is formed from substantially the same layer as the source and drain electrodes 233 and 234 of the first diodes GD1, GD2, . . . , and the source and drain electrodes 213 and 214 of the switching element TFT1. In FIGS. 1 to 3, the first test line 271 of the first test part 270 and the source and drain electrodes 233 and 234 of the first diodes GD1, GD2, . . . , and the source and drain electrodes 213 and 214 of the switching element TFT1 include a metal layer. The first test pad 272 of the first test part 270 and the pixel electrode 216, as well as the first and second connecting patterns 235, 236, may include a transparent conductive material.

Figure 4:
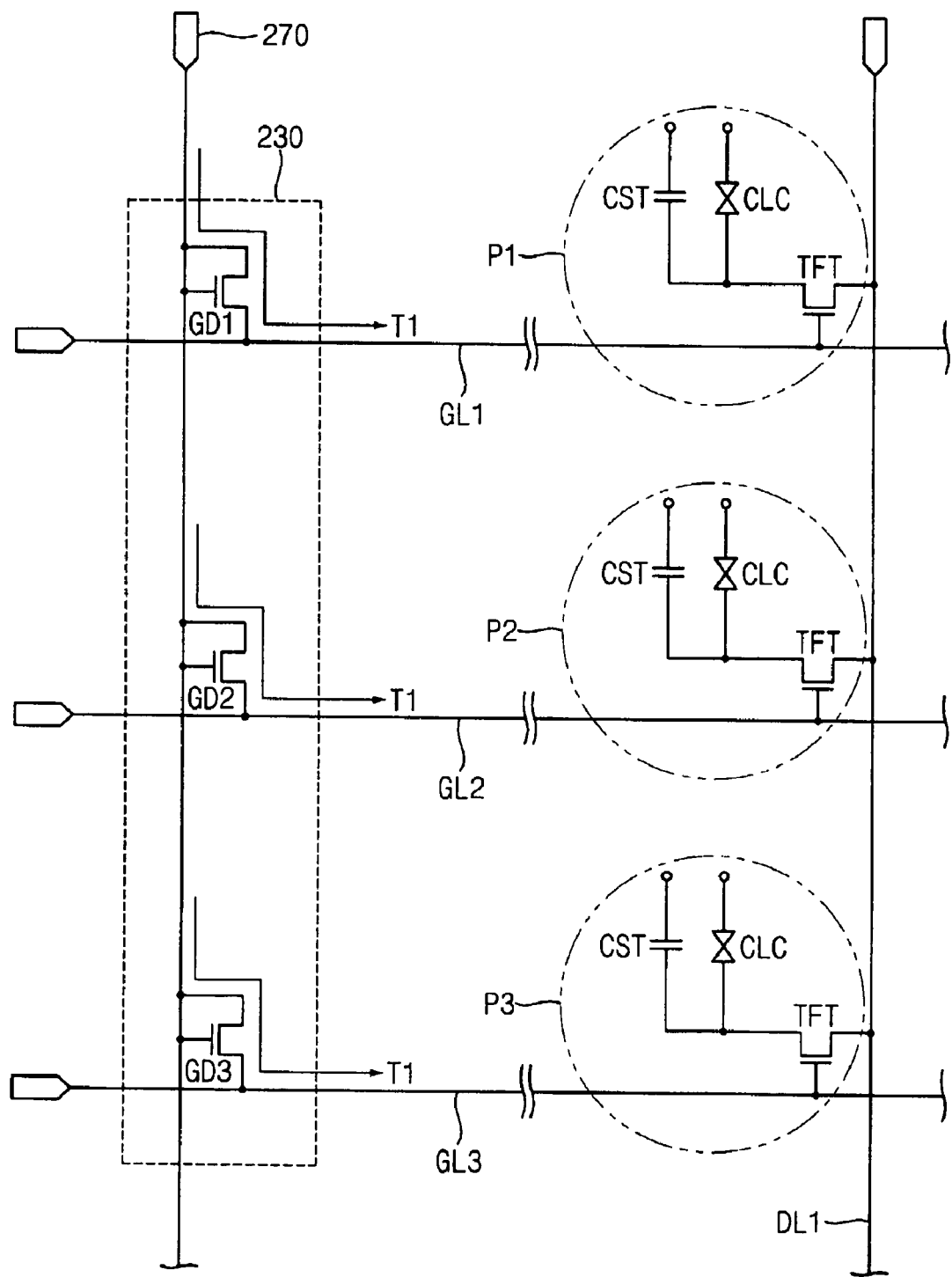
FIG. 4 is an equivalent circuit diagram illustrating an exemplary display panel having an exemplary first diode static dissipative part according to another exemplary embodiment of the present invention.

FIG. 4 is an equivalent circuit diagram illustrating an exemplary display panel having an exemplary first diode static dissipative part according to another exemplary embodiment of the present invention.

Referring to FIG. 4, a plurality of pixel parts P1, P2, . . . is formed in the display region DA of the display panel 100. The first diode static dissipative part 230 that discharges a static charge applied to gate lines GL1, GL2, . . . , through one terminal of the gate lines GL1, GL2, . . . , is formed in a peripheral region PA surrounding the display region DA. A first test part 270 is formed in the peripheral region PA. The first test part 270 transfers a first test signal to the display region DA through the first diode static dissipative part 230.

Each of the pixel parts P1, P2, P3, . . . , includes a switching element TFT, a liquid crystal capacitor CLC, and a storage capacitor CST. A gate electrode of the switching element TFT is electrically connected to its respective gate line GL. A drain electrode of the switching element TFT is electrically connected to the liquid crystal capacitor CLC and the storage capacitor CST.

The first diode static dissipative part 230 includes a plurality of first diodes GD1, GD2, GD3, . . . , that are electrically connected to the gate lines GL1, GL2, GL3, . . . , respectively.

Each of the first diodes GD1, GD2, GD3, . . . , has a gate electrode electrically connected to the first test part 270, a source electrode electrically connected to the first test part 270, and a drain electrode electrically connected to the respective gate line GL1, GL2, GL3, . . . .

When the first test signal T1 is applied to the first test part 270, the first test signal T1 is applied to the first diode static dissipative part 230 through the first test part 270. The first test signal T1 is applied to the pixel parts P1, P2, P3, . . . , of the display region through the first diodes GD1, GD2, GD3, . . . .

The first test signal T1 is applied to the gate lines GL1, GL2, GL3, . . . , through the first test part 270 that is electrically connected to the first diode static dissipative part 230. The gate lines GL1, GL2, GL3, . . . , are formed in the display region DA. Thus, the gate lines GL1, GL2, GL3, . . . , may be easily tested to detect an open circuit or a short circuit of the gate lines GL1, GL2, GL3, . . . .

Figure 5:
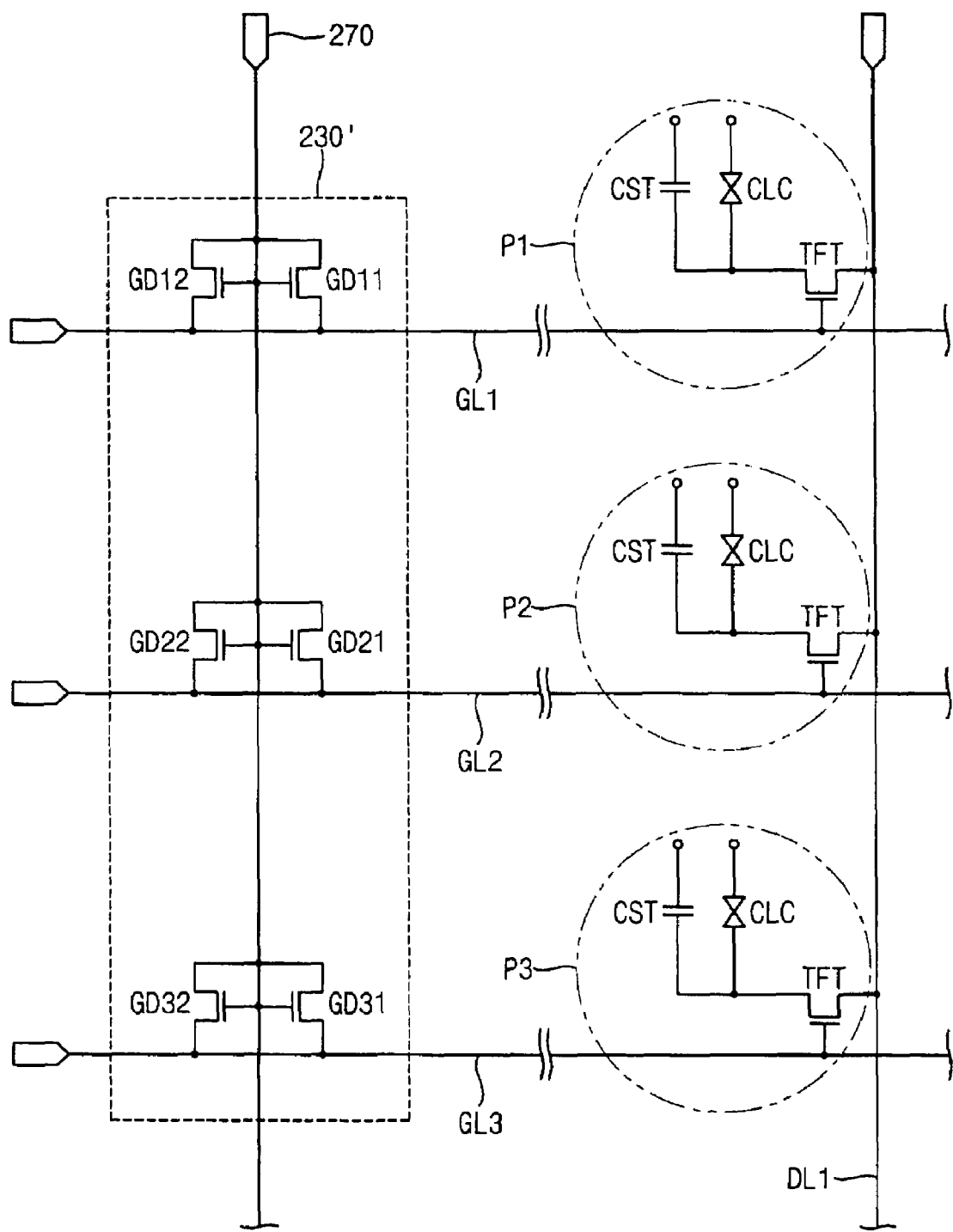
FIG. 5 is an equivalent circuit diagram illustrating an exemplary display panel having an exemplary first diode static dissipative part according to another exemplary embodiment of the present invention.

FIG. 5 is an equivalent circuit diagram illustrating an exemplary display panel having an exemplary first diode static dissipative part according to another exemplary embodiment of the present invention. The display panel of FIG. 5 is substantially the same as the display panel of FIG. 4 except for the first diode static dissipative part. Therefore, description of the same elements will be omitted.

Referring to FIG. 5, a first diode static dissipative part 230' includes two diodes GD11 and GD12, GD21 and GD22, GD31 and GD32, . . . that are electrically connected to each of gate lines GL1, GL2, GL3, . . . .

Each of the two diodes GD11 and GD12, GD21 and GD22, GD31 and GD32, . . . has a gate electrode electrically connected to the first test part 270, a source electrode electrically connected to the first test part 270, and a drain electrode electrically connected to the respective gate line GL1, GL2, GL3, . . . .

Therefore, a first test signal from the first test part 270 is applied to pixel parts P1, P2, P3, . . . , of the display region through the first diode static dissipative part 230'.

Figure 6:
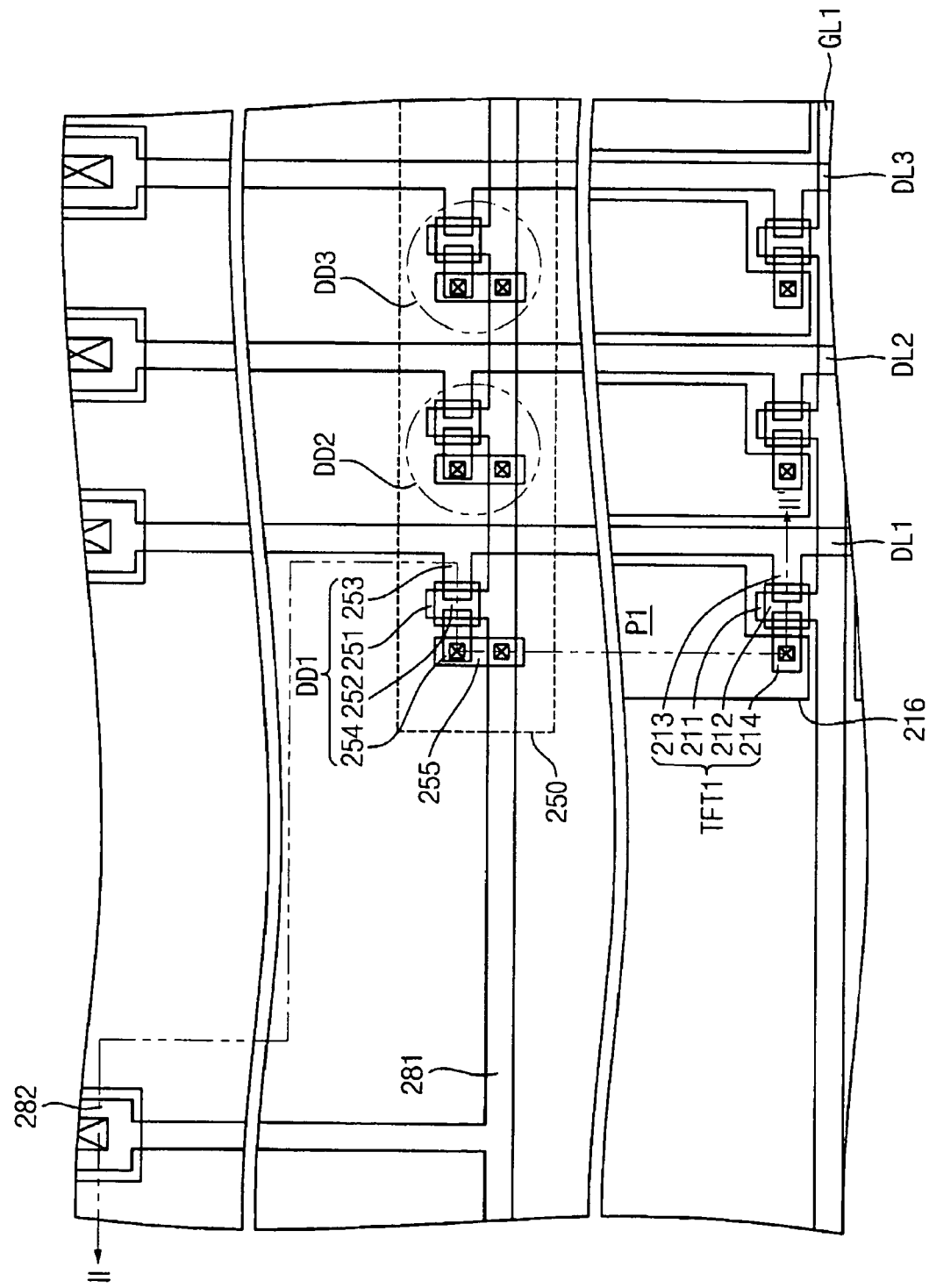
FIG. 6 is a partial plan view illustrating an exemplary first display substrate shown in FIG. 1.
Figure 7:
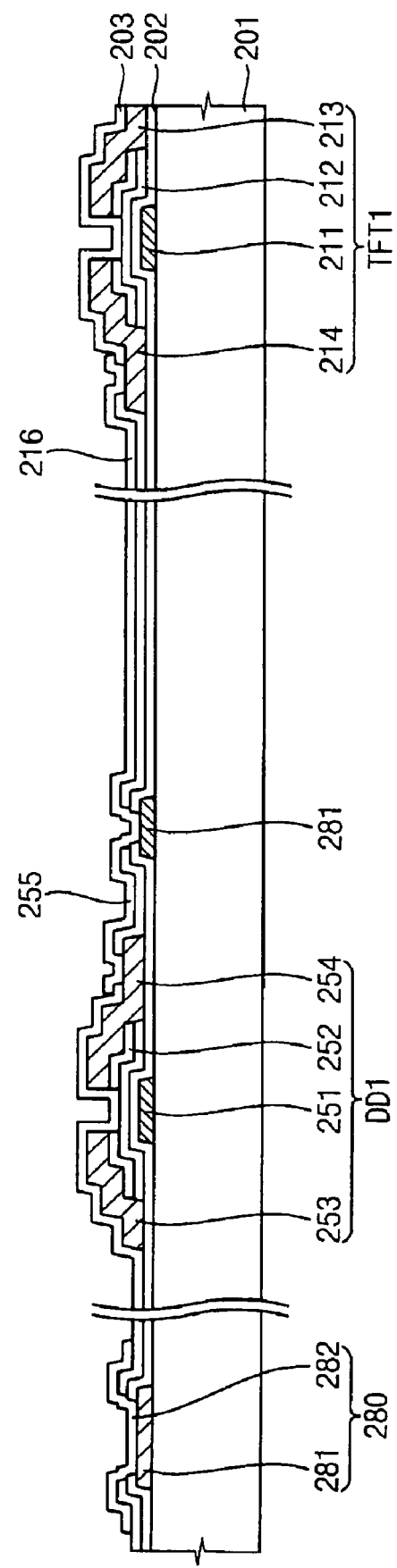
FIG. 7 is a cross-sectional view taken along line II-II' shown in FIG. 6.

FIG. 6 is a partial plan view illustrating an exemplary first display substrate shown in FIG. 1. FIG. 7 is a cross-sectional view taken along line II-II' shown in FIG. 6.

Referring to FIGS. 6 and 7, the first display substrate 200 includes a base substrate 201. A plurality of pixel parts P1, a second diode static dissipative part 250, and a second test part 280 are formed on the base substrate 201.

An exemplary pixel part P1 is illustrated and described, however the remaining pixel parts P may include a similar arrangement. Pixel part P1 includes a switching element TFT1 and a pixel electrode 216. The switching element TFT1 includes a gate electrode 211, a source electrode 213, and a drain electrode 214. The gate electrode 211 of the switching element TFT1 is electrically connected to a gate line GL1. The source electrode 213 of the switching element TFT1 is electrically connected to the source line DL1. The drain electrode 214 of the switching element TFT1 is electrically connected to the pixel electrode 216. A channel part 212 of the switching element TFT1 is formed on the gate electrode 211 between the source electrode 213 and the drain electrode 214.

In addition, a gate-insulating layer 202 is formed between the gate electrode 211 and the channel part 212 of the switching element TFT1. A passivation layer 203 is formed on the source and drain electrodes 213 and 214.

The second diode static dissipative part 250 includes a plurality of second diodes DD1, DD2, . . . , that are electrically connected to the source lines DL1, DL2, . . . . The second test line 281 of the second test part 280 is electrically connected to the second diode static dissipative part 250. The second test pad 282 is on one terminal of the second test line 281.

Particularly, each of the second diodes DD1, DD2, . . . , includes a gate electrode 251, a source electrode 254, and a drain electrode 253. The gate electrode 251 of each of the second diodes DD1, DD2, . . . , and the source electrode 254 of each of the second diodes DD1, DD2, . . . , are electrically connected to the second test line 281. The drain electrode 253 of each of the second diodes DD1, DD2, . . . , is electrically connected to the source lines DL1, DL2, . . . .

The gate electrode 251 of each of the second diodes DD1, DD2, . . . , is extended from the second test line 281, and is therefore electrically connected to the second test line 281. The source electrode 254 of each of the second diodes DD1, DD2, . . . , is electrically connected to the second test line 281 through a connecting pattern 255.

The drain electrode 253 of each of the second diodes DD1, DD2, . . . , is extended from the source lines DL1, DL2, . . . and is therefore electrically connected to the source lines DL1, DL2, . . . . Each of the second diodes DD1, DD2, . . . , may further include a channel part 252 on the gate electrode 251 between the source and drain electrodes 254 and 253. The connecting pattern 255 is formed from substantially the same layer as the pixel electrode 216 that is in each of the pixel parts P, and includes a conductive pattern.

In addition, the gate-insulating layer 202 is formed between the gate electrode 251 and the channel part 252 of each of the second diodes DD1, DD2, . . . . That is, the gate-insulating layer 202 may be between the gate electrodes 211 and 251 and the channel parts 212 and 252. The passivation layer 203 is formed on the source and drain electrodes 254 and 253 of each of the second diodes DD1, DD2, . . . . That is, the passivation layer 203 may be on the source and drain electrodes 213 and 214 of the switching transistor TFT of each of the pixel parts P and the source and drain electrodes 254 and 253 of each of the second diodes DD1, DD2, . . . .

The second test line 281 of the second test part 280 may include substantially the same metal as the source and drain electrodes 213 and 214 of the switching transistor TFT1 and the source and drain electrodes 254 and 253 of each of the second diodes DD1, DD2, . . . . The second test pad 282 of the second test part 280, as well as the connecting pattern 255, includes substantially the same conductive material as the pixel electrode 216.

Figure 8:
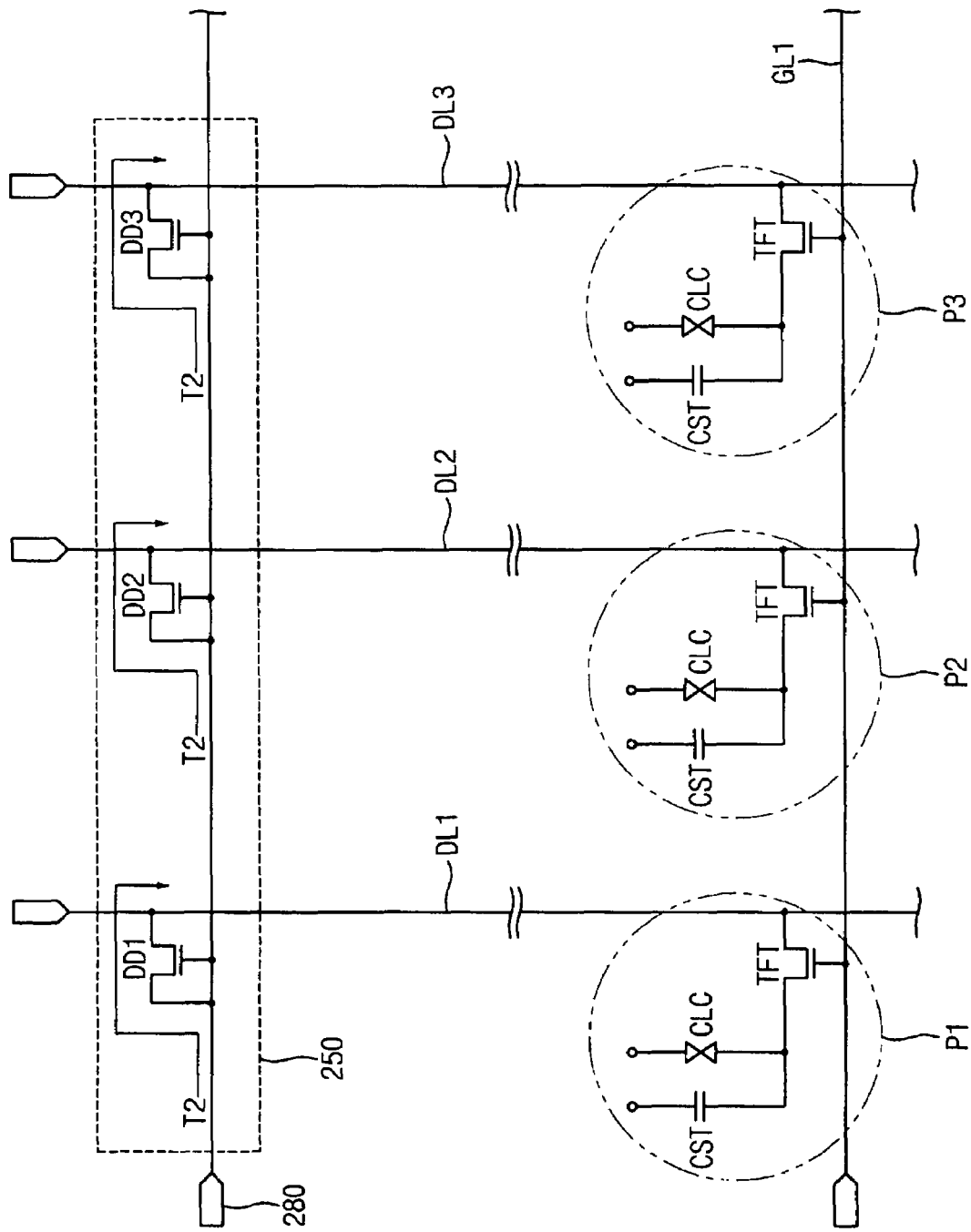
FIG. 8 is an equivalent circuit diagram illustrating an exemplary display panel having an exemplary second diode static dissipative part according to another exemplary embodiment of the present invention.

FIG. 8 is an equivalent circuit diagram illustrating an exemplary display panel having an exemplary second diode static dissipative part according to another exemplary embodiment of the present invention.

Referring to FIG. 8, a plurality of pixel parts P1, P2, P3, . . . , is formed in a display region DA of the display panel 100, and a second diode static dissipative part 250 that discharges a static charge applied to source lines DL1, DL2, DL3, . . . , is formed in a peripheral region PA surrounding the display region DA. A second test part 280 is formed in the peripheral region PA. The second test part 280 transfers a second test signal T2 to the display region DA through the second diode static dissipative part 250.

Each of the pixel parts P1, P2, P3, . . . , includes a switching element TFT, a liquid crystal capacitor CLC, and a storage capacitor CST. A gate electrode of each switching element TFT is electrically connected to a respective gate line GL. A drain electrode of each switching element TFT is electrically connected to the liquid crystal capacitor CLC and the storage capacitor CST.

The second diode static dissipative part 250 includes a plurality of second diodes DD1, DD2, DD3, . . . , that are electrically connected to source lines DL1, DL2, DL3, . . . , respectively.

Each of the second diodes DD1, DD2, DD3, . . . , includes a gate electrode electrically connected to the second test part 280, a source electrode electrically connected to the second test part 280, and a drain electrode electrically connected to the source lines DL1, DL2, DL3, . . . .

When the second test signal T2 is applied to the second test part 280, the second test signal T2 is applied to the second diode static dissipative part 250 through the second test part 280. The second test signal T2 is applied to the pixel parts P1, P2, P3, . . . , of the display region DA through the second diodes DD1, DD2, DD3, . . . .

The second test signal T2 is applied to the source lines DL1, DL2, DL3, . . . , through the second test part 280 that is electrically connected to the second diode static dissipative part 250. The source lines DL1, DL2, DL3, . . . , are formed in the display region DA. Thus, the source lines DL1, DL2, DL3, . . . , may be easily tested to detect an open circuit or a short circuit of the source lines DL1, DL2, DL3, . . . .

Figure 9:
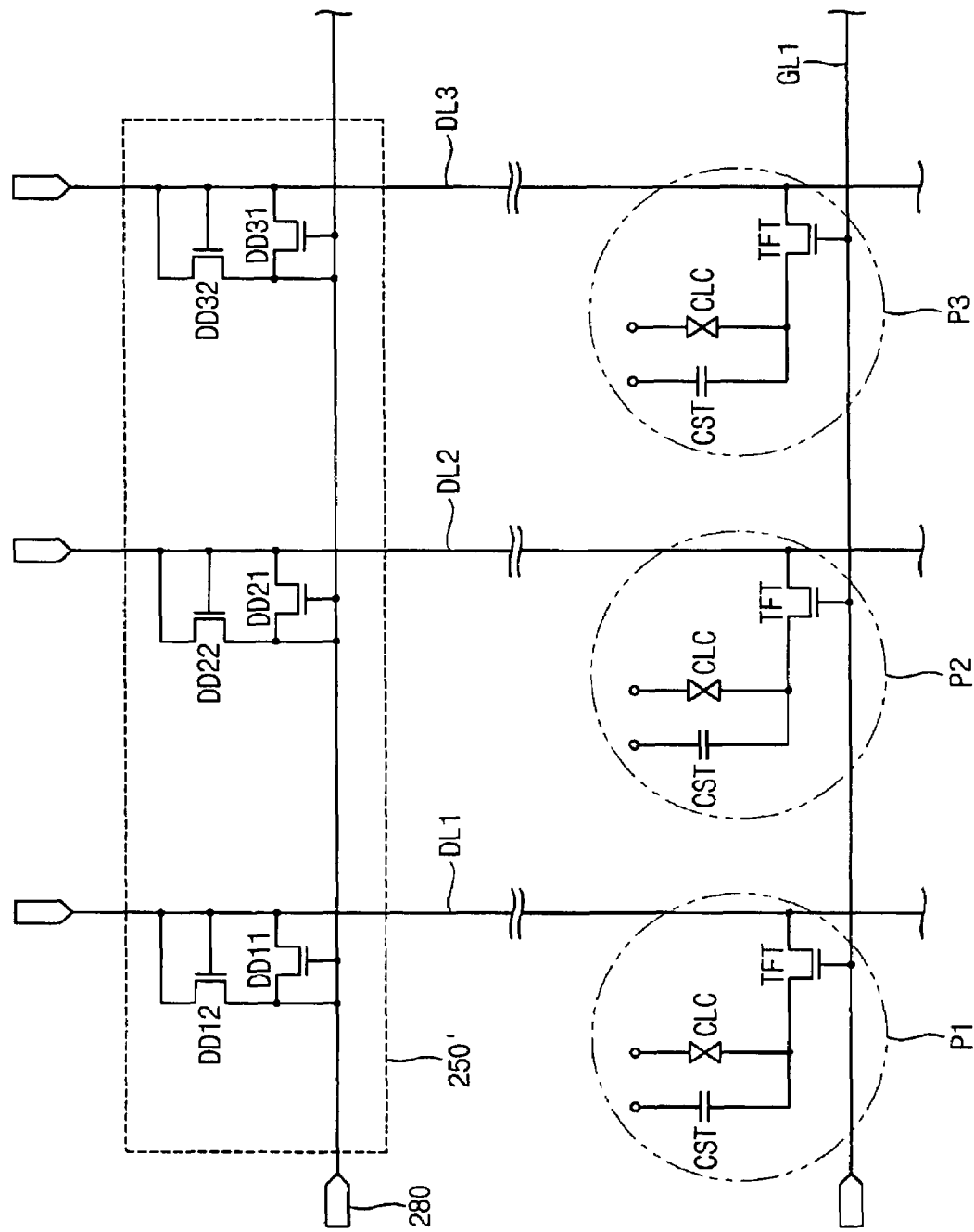
FIG. 9 is an equivalent circuit diagram illustrating an exemplary display panel having an exemplary first diode static dissipative part according to another exemplary embodiment of the present invention.

FIG. 9 is an equivalent circuit diagram illustrating an exemplary display panel having an exemplary second diode static dissipative part according to another exemplary embodiment of the present invention. The display panel of FIG. 9 is substantially the same as the display panel of FIG. 8 except for the second diode static dissipative part. Therefore, description of the same elements will be omitted.

Referring to FIG. 9, a second diode static dissipative part 250' includes two diodes DD11 and DD12, DD21 and DD22, DD31 and DD2, . . . electrically connected to respective source lines DL1, DL2, DL3, . . . .

Each of the two diodes DD11 and DD12, DD21 and DD22, DD31 and DD32, . . . has a gate electrode electrically connected to the second test part 280, a source electrode electrically connected to the second test part 280, and a drain electrode electrically connected to a respective one of the source lines DL1, DL2, DL3, . . . .

Therefore, a second test signal from the second test part 280 is applied to pixel parts P1, P2, P3 of a display region DA through the second diode static dissipative part 250'.

Figure 10:
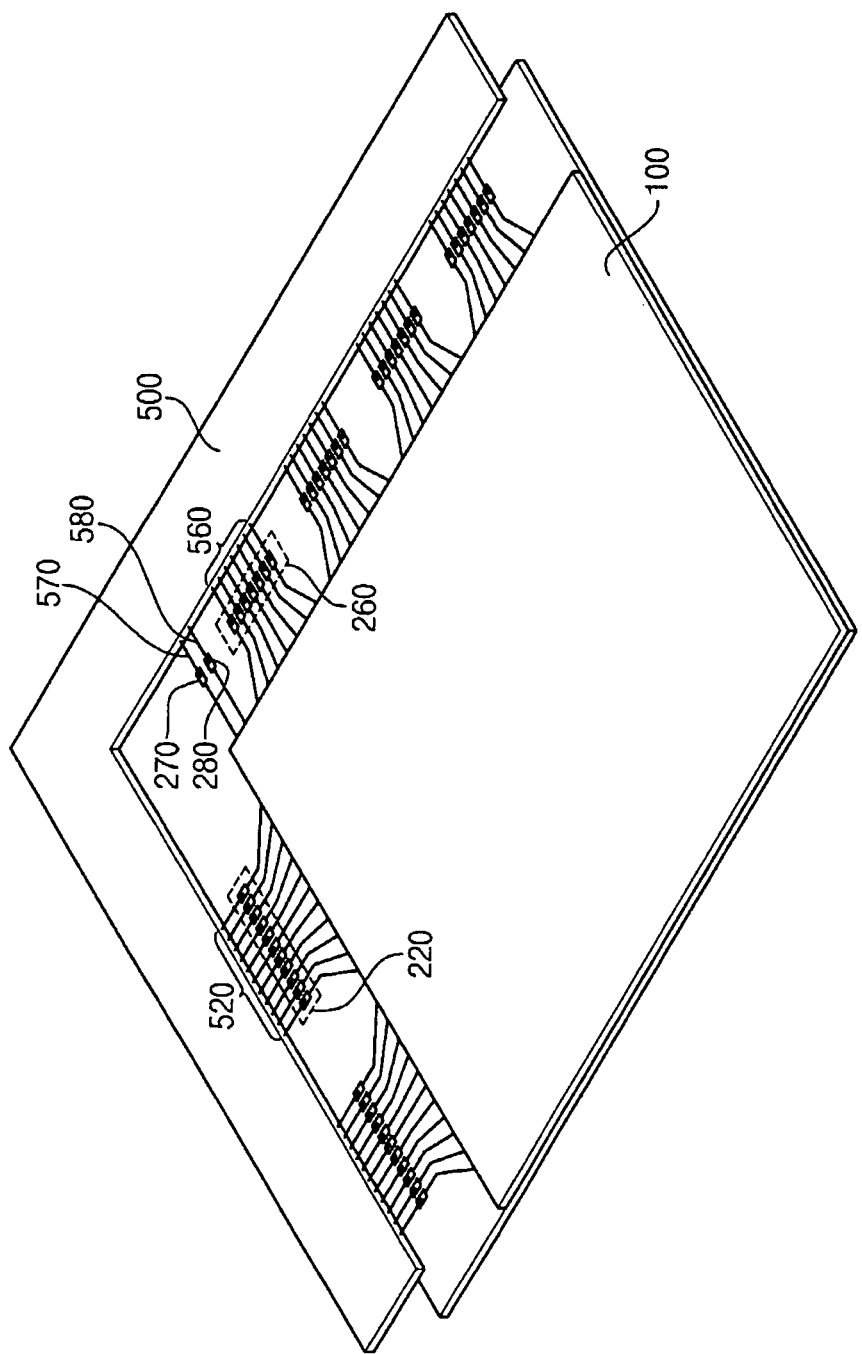
FIG. 10 is a perspective view illustrating an exemplary apparatus for performing a gross test according to an exemplary embodiment of the present invention.
Figure 11:
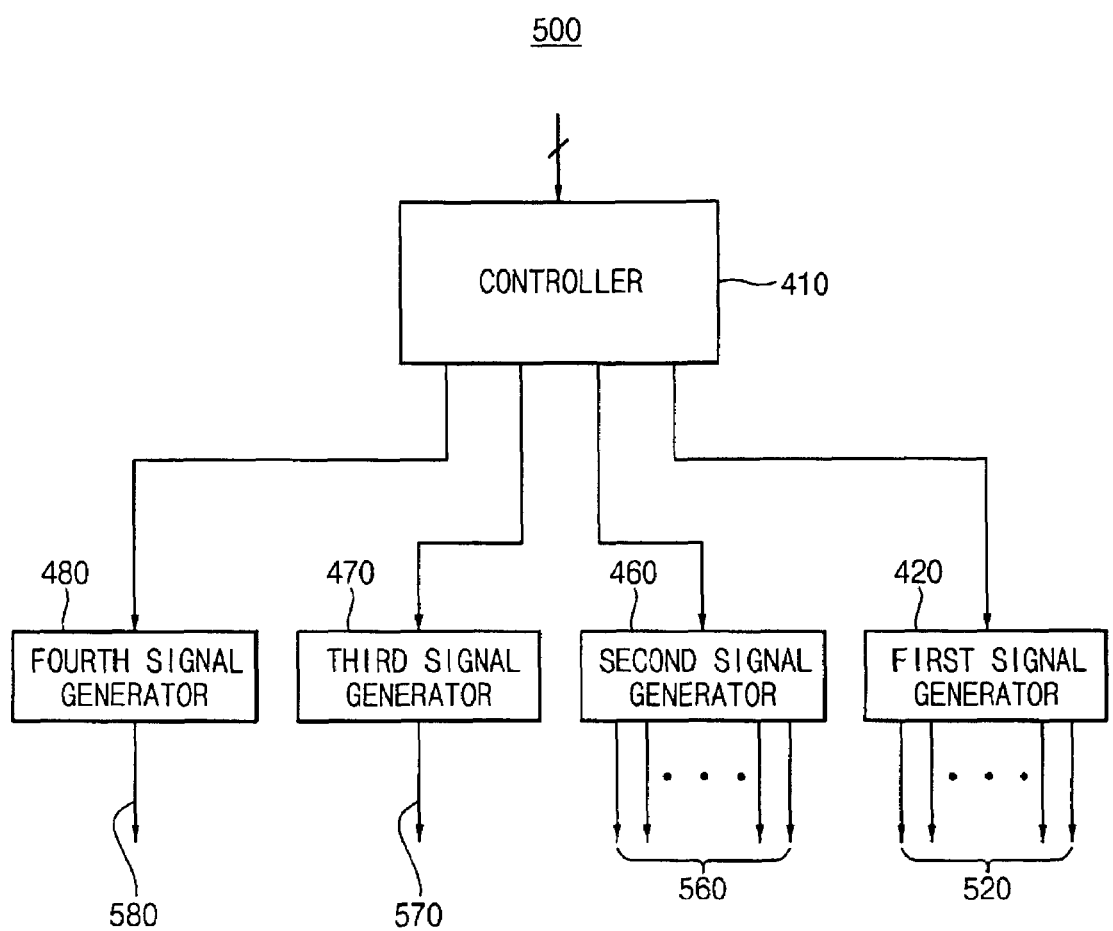
FIG. 11 is a block diagram illustrating the exemplary apparatus shown in FIG. 10.

FIG. 10 is a schematic perspective view illustrating an exemplary apparatus for performing a gross test according to an exemplary embodiment of the present invention. FIG. 11 is a block diagram illustrating the exemplary testing apparatus shown in FIG. 10.

Referring to FIGS. 1, 10 and 11, a testing apparatus 500 includes a plurality of signal generators 420, 460, 470, and 480 and a controller 410. The signal generators 420, 460, 470, and 480 are electrically connected to a gate pad part 220, a source pad part 260, a first test part 270, and a second test part 280, respectively. The gate pad part 220, the source pad part 260, the first test part 270, and the second test part 280 are formed on a display panel 100. The controller 410 controls the signal generators 420, 460, 470 and 480 to generate test signals.

Particularly, the first signal generator 420 includes a plurality of first output pins 520. The first output pins 520 are electrically connected to a plurality of pads of the gate pad part 220, and forward a gate-test signal to the gate pad part 220.

The second signal generator 460 includes a plurality of second output pins 560. The second output pins 560 are electrically connected to a plurality of pads (pads 261 as shown in FIG. 3) of the source pad part 260, and forward a source-test signal to the source pad part 260.

The third signal generator 470 includes a third output (generating) pin 570 electrically connected to the first test part 270, and applies a first test signal to the first test part 270. The first test signal from the first test part 270 is applied to gate lines GL through a first diode static dissipative part 230. The first test signal is a gate-on voltage that activates the gate lines. For example, a level of the first test signal may be about 20 V to about 30 V.

The fourth signal generator 480 includes a fourth output (generating) pin 580 electrically connected to the second test part 280, and applies a second test signal to the second test part 280. The second test signal from the second test part 280 is applied to source lines DL through the second diode static dissipative part 250. The second test signal is a data voltage corresponding to a gray-scale.

The controller 410 controls the signal generators 420, 460, 470 and 480 based on test control signals that are provided from an exterior to the controller 410.

Particularly, when the test signal for detecting defects of pixels is applied to the controller 410, the controller 410 controls the first and second signal generators 420 and 460 to apply the gate and source test signals to the gate and source pad parts 220 and 260 through the first and second output pins 520 and 560, respectively. In this case, the controller 410 controls the third and fourth signal generators 470 and 480 so that the first and second test signals may not be applied to the third and fourth output pins 570 and 580 of the third and fourth signal generators 470 and 480.

When the test signal for detecting defects of lines is applied to the controller 410, the controller 410 controls the third and fourth signal generators 470 and 480 to apply the first and second test signals to the first and second test parts 270 and 280 through the third and fourth output pins 570 and 580, respectively. In this case, the controller 410 controls the first and second signal generators 420 and 460 so that the gate and source test signals may not be applied to the first and second output pins 520 and 560 of the first and second signal generators 420 and 460.

Figure 12A:
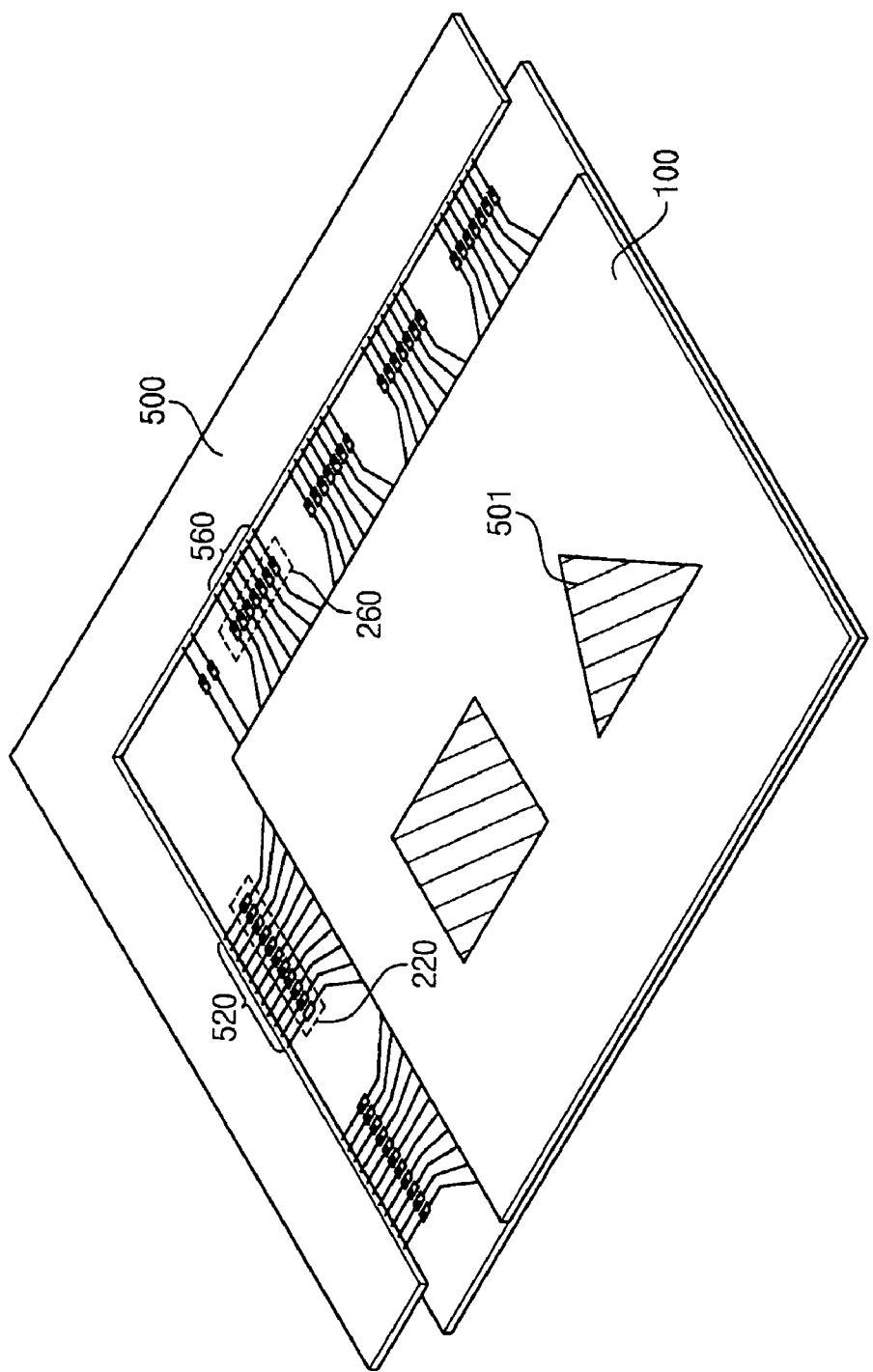
FIGS. 12A and 12B are perspective views illustrating an exemplary method for gross-testing an exemplary display panel using the exemplary apparatus shown in FIG. 11.
Figure 12B:
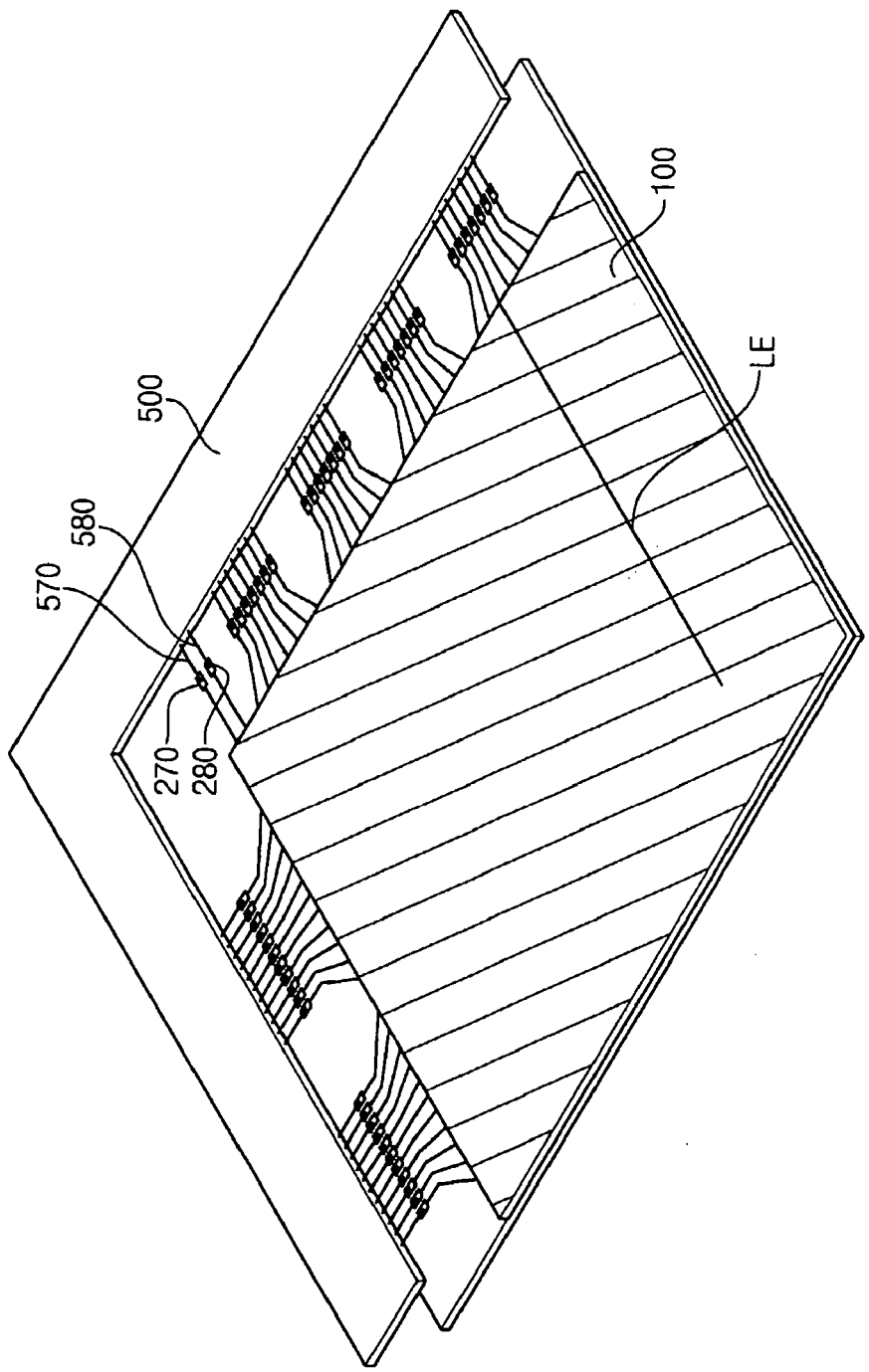

FIGS. 12A and 12B are perspective views illustrating an exemplary method for gross testing an exemplary display panel using the exemplary apparatus shown in FIG. 11.

FIG. 12A is a perspective view illustrating testing an image display quality using the exemplary test apparatus shown in FIG. 11.

Referring to FIGS. 11 and 12A, the test apparatus 500 outputs the gate and the source test signal to the display panel 100 through the first and the second signal generators 420 and 460 to display an image pattern 501 on the display panel 100. In this case, the test apparatus 500 does not output the first and second test signals to the third and fourth output (generating) pins 570 and 580.

The first signal generator 420 outputs the gate test signals for activating gate lines GL of the display panel 100 through the first output pins 520. The gate test signal is applied to the gate pad part 220 that is electrically connected to the first output pins 520.

The second signal generator 460 applies the source test signal corresponding to the image pattern 501 to the source lines DL of the display panel 100 through the second output pins 560. Thus, the source test signal is applied to the source pad part 260 that is electrically connected to the second output pins 560.

Therefore, the image pattern 501 for testing the display panel 100 is displayed on the display panel 100 to detect defects of the pixels and the lines using the image pattern 501.

FIG. 12B is a perspective view illustrating detecting a defect of a line on an exemplary display panel using the exemplary test apparatus shown in FIG. 11.

Referring to FIGS. 1, 11, and 12B, the test apparatus 500 outputs the first and second test signals for testing the lines of the display panel 100 to the display panel 100, through third and fourth signal generators 570 and 580, respectively. In this case, the test apparatus 500 does not output the gate and source test signals to first and second output pins 520 and 560.

The third signal generator 570 generates the first test signal for activating the gate lines GL so that the first test signal is applied to the first test part 270 that is electrically connected to the third signal generator 570. The first test signal is applied to the gate lines GL through the first diode static dissipative part 230 that is electrically connected to the gate lines GL.

The fourth signal generator 580 applies the second test signal to the second test part 280 that is electrically connected to the fourth signal generator 580. The second test signal is applied to the source lines DL through the second diode static dissipative part 250 that is electrically connected to the source lines DL.

The first and second test signals are simultaneously applied to the gate and source lines GL and DL of the display panel 100 through the first and second test parts 270 and 280, respectively. Therefore, the display panel 100 displays an image having a predetermined gray-scale corresponding to the second test signal.

When the source and gate lines DL and GL of the display panel 100 includes an open circuit or a short circuit, the defect LE of the source and gate lines DL and GL is displayed in a linear-shape.

Thus, a disconnection between the pins of the testing apparatus and pads of the display panel is prevented using the testing apparatus of exemplary embodiments of the present invention, thereby improving credibility of the test.

According to the present invention, a first test part is electrically connected to a first diode static dissipative part to discharge a static charge applied to a gate pad part, and a second test part is electrically connected to a second diode static dissipative part to discharge a static charge applied to a source pad part.

First and second test signals are applied to the first and second test parts to test lines of the display panel during a gross test of the display panel, to decrease an error formed by a disconnection between pins of a testing apparatus and pads of the display panel.

Therefore, manufacturing efficiency of the display panel and credibility of the test may be increased. In addition, defects of the display panel may be decreased, thereby increasing a yield of the display panel manufacturing process. Furthermore, manufacturing costs of the display panel may be decreased.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display substrate comprising:
   a gate pad part on one terminal of each of a plurality of gate lines, the gate pad part transferring a signal to each of the gate lines;
   a source pad part on one terminal of each of a plurality of source lines, the source pad part transferring a signal to each of the source lines;
   a first static dissipative part dispersing a static charge applied to the source lines;
   a first test part for receiving a first test signal from an exterior of the display substrate and electrically connected to the first static dissipative part;
   a storage voltage line receiving a common voltage;
   a plurality of pixel parts, wherein the first static dissipative part is formed between the source pad part and the plurality of pixel parts; and
   a static discharging part electrically connected to the storage voltage line and disposed between the first static dissipative part and the plurality of pixel parts, wherein the static discharging part discharges a static charge applied to the first static dissipative part or the source lines to prevent a malfunction of the pixel parts.

2. The display substrate of claim 1, wherein the first test part comprises:
   a first test line electrically connected to the first static dissipative part; and
   a first test pad electrically connected to the first test line and receiving the first test signal.

3. The display substrate of claim 2, wherein the first static dissipative part comprises a diode including a first electrode connected the source line and a second electrode connected to the first test line.

4. The display substrate of claim 3, wherein the static discharging part comprises a thin film transistor including a first electrode connected the storage voltage line, a second electrode connected to the source line, and a third electrode connected to a discharge electrode.

5. The display substrate of claim 1, wherein the first test signal is a data voltage corresponding to a gray-scale.

6. The display substrate of claim 1, wherein the first static dissipative part comprises a plurality of first diodes.

7. The display substrate of claim 6, wherein each of the first diodes comprises a gate electrode electrically connected to the first test part, a source electrode electrically connected to the first test part, and a drain electrode electrically connected to one of the source lines.

8. The display substrate of claim 6, wherein each of the first diodes comprises a plurality of diodes, and each of the plurality of diodes includes a gate electrode electrically connected to the first test part, a source electrode electrically connected to the first test part, and a drain electrode electrically connected to one of the source lines.

9. The display substrate of claim 1, further comprising:
   a second static dissipative part dispersing a static charge applied to the gate pad part; and
   a second test part receiving a second test signal from the exterior of the display substrate and electrically connected to the second static dissipative part,
   wherein the second test signal from the second test part is applied to the gate lines through the second static dissipative part.

10. The display substrate of claim 9, wherein the second test part comprises:
    a second test line electrically connected to the second static dissipative part; and
    a second test pad electrically connected to the second test line and receiving the second test signal.

11. The display substrate of claim 9, further comprising a plurality of pixel parts, wherein the second static dissipative part is formed between the gate pad part and the plurality of pixel parts.

12. The display substrate of claim 9, wherein the second static dissipative part comprises a plurality of second diodes.

13. The display substrate of claim 12, wherein each of the second diodes comprises a gate electrode electrically connected to the second test part, a source electrode electrically connected to the second test part, and a drain electrode electrically connected to one of the gate lines.

14. The display substrate of claim 12, wherein each of the second diodes comprises a plurality of diodes, and each of the plurality of the diodes includes a gate electrode electrically connected to the second test part, a source electrode electrically connected to the second test part, and a drain electrode electrically connected to one of the gate lines.

15. The display substrate of claim 9, wherein the second test signal is a gate-on voltage activating the gate lines.

16. The display substrate of claim 15, wherein the first test signal is a data voltage corresponding to a gray-scale.

17. The display substrate of claim 16, wherein the first test signal and the second test signal are substantially simultaneously applied to the gate and source lines.

18. A display substrate comprising:
    a gate pad part on one terminal of each of a plurality of gate lines, the gate pad part transferring a signal to each of the gate lines;
    a source pad part on one terminal of each of a plurality of source lines, the source pad part transferring a signal to each of the source lines;
    a first static dissipative part dispersing a static charge applied to the source lines;
    a first test part for receiving a first test signal from an exterior of the display substrate and electrically connected to the first static dissipative part;
    a storage voltage line receiving a common voltage;
    a plurality of pixel parts, wherein the first static dissipative part is formed between the gate pad part and the plurality of pixel parts; and
    a static discharging part electrically connected to the storage voltage line, wherein the static discharging part discharges a static charge applied to the first static dissipative part or the source lines to prevent a malfunction of the pixel parts.

19. The display substrate of claim 18, wherein the first test part comprises:
    a first test line electrically connected to the first static dissipative part; and a first test pad electrically connected to the first test line and receiving the first test signal.

20. The display substrate of claim 19, wherein the first static dissipative part comprises a diode including a first electrode connected the source line and a second electrode connected to the first test line.

21. The display substrate of claim 20, wherein the static discharging part comprises a thin film transistor including a first electrode connected the storage voltage line, a second electrode connected to the source line and a third electrode connected to a discharge electrode.

* * * * *